(12) United States Patent
Chen et al.

(10) Patent No.: US 10,770,502 B2
(45) Date of Patent: Sep. 8, 2020

(54) SEMICONDUCTOR IMAGE SENSOR DEVICE HAVING BACK SIDE ILLUMINATED IMAGE SENSORS WITH EMBEDDED COLOR FILTERS

(71) Applicant: Taiwan Semiconductor Manufacturing Company, Ltd., Hsin-Chu (TW)

(72) Inventors: Chiu-Jung Chen, Tainan (TW); Chun-Hao Chou, Tainan (TW); Hsin-Chi Chen, Tainan (TW); Kuo-Cheng Lee, Tainan (TW); Volume Chien, Tainan (TW); Yung-Lung Hsu, Tainan (TW); Yun-Wei Cheng, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/693,651

(22) Filed: Nov. 25, 2019

(65) Prior Publication Data
US 2020/0091211 A1    Mar. 19, 2020

Related U.S. Application Data

(60) Continuation of application No. 16/220,362, filed on Dec. 14, 2018, now Pat. No. 10,490,590, which is a
(Continued)

(51) Int. Cl.
*H01L 27/146* (2006.01)

(52) U.S. Cl.
CPC ...... *H01L 27/1464* (2013.01); *H01L 27/1462* (2013.01); *H01L 27/1463* (2013.01);
(Continued)

(58) Field of Classification Search
CPC ............ H01L 27/1464; H01L 27/1462; H01L 27/14621; H01L 27/14623; H01L 27/1463;
(Continued)

(56) References Cited

U.S. PATENT DOCUMENTS

| 8,760,545 B2 | 6/2014 | Takimoto et al. |
| 9,281,338 B2 | 3/2016 | Chen et al. |

(Continued)

FOREIGN PATENT DOCUMENTS

CN    101853812    10/2010

OTHER PUBLICATIONS

International Search Report and Written Opinion issued for PCT/US2013/054795 dated May 23, 2014, 14 pages.

*Primary Examiner* — Michael Jung
(74) *Attorney, Agent, or Firm* — Haynes and Boone, LLP

(57) ABSTRACT

Disclosed is a method of fabricating a semiconductor image sensor device. The method includes providing a substrate having a pixel region, a periphery region, and a bonding pad region. The substrate further has a first side and a second side opposite the first side. The pixel region contains radiation-sensing regions. The method further includes forming a bonding pad in the bonding pad region; and forming light-blocking structures over the second side of the substrate, at least in the pixel region, after the bonding pad has been formed.

20 Claims, 14 Drawing Sheets

Related U.S. Application Data continuation of application No. 15/727,716, filed on Oct. 9, 2017, now Pat. No. 10,181,491, which is a continuation of application No. 15/284,790, filed on Oct. 4, 2016, now Pat. No. 9,786,716, which is a continuation of application No. 15/050,819, filed on Feb. 23, 2016, now Pat. No. 9,461,089, which is a division of application No. 14/261,472, filed on Apr. 25, 2014, now Pat. No. 9,281,338.

(52) U.S. Cl.
CPC .. *H01L 27/14621* (2013.01); *H01L 27/14623* (2013.01); *H01L 27/14632* (2013.01); *H01L 27/14636* (2013.01); *H01L 27/14645* (2013.01); *H01L 27/14685* (2013.01); *H01L 27/14687* (2013.01); *H01L 27/14689* (2013.01); *H01L 27/14698* (2013.01); *H01L 2224/48463* (2013.01)

(58) Field of Classification Search
CPC ......... H01L 27/14632; H01L 27/14636; H01L 27/14645; H01L 27/14685; H01L 27/14687; H01L 27/14689; H01L 27/14698

See application file for complete search history.

(56) References Cited

U.S. PATENT DOCUMENTS

| | | |
|---|---|---|
| 9,368,531 B2 | 6/2016 | Cheng et al. |
| 9,543,353 B2 | 1/2017 | Cheng et al. |
| 9,553,118 B2 | 1/2017 | Cheng et al. |
| 9,825,085 B2 | 11/2017 | Cheng et al. |
| 2008/0204580 A1 | 8/2008 | Holscher |
| 2008/0224181 A1 | 9/2008 | Uya et al. |
| 2009/0146148 A1 | 6/2009 | Pyo |
| 2009/0200591 A1* | 8/2009 | Park .................. H01L 27/14621 257/292 |
| 2009/0200622 A1 | 8/2009 | Tai et al. |
| 2009/0242948 A1 | 10/2009 | Barrett et al. |
| 2010/0230729 A1 | 9/2010 | Ellis-Monaghan et al. |
| 2010/0244173 A1 | 9/2010 | Wang et al. |
| 2010/0244287 A1 | 9/2010 | Hsu et al. |
| 2010/0327390 A1 | 12/2010 | Mccarten et al. |
| 2011/0298072 A1 | 12/2011 | Chuang et al. |
| 2012/0049306 A1 | 3/2012 | Ohba et al. |
| 2012/0086094 A1 | 4/2012 | Wantanabe et al. |
| 2012/0147208 A1 | 6/2012 | Otsuka et al. |
| 2012/0261781 A1 | 10/2012 | Hsu et al. |
| 2012/0288979 A1 | 11/2012 | Koizumi et al. |
| 2012/0292728 A1 | 11/2012 | Tsai et al. |
| 2012/0313208 A1 | 12/2012 | Kim et al. |
| 2012/0320242 A1 | 12/2012 | Ogita et al. |
| 2013/0009270 A1 | 1/2013 | Tsai et al. |
| 2013/0032920 A1 | 2/2013 | Lin et al. |
| 2013/0200251 A1 | 8/2013 | Velichko |
| 2013/0241018 A1 | 9/2013 | JangJian et al. |
| 2013/0249040 A1 | 9/2013 | Liu et al. |
| 2013/0270667 A1 | 10/2013 | Wang et al. |
| 2014/0131828 A1 | 5/2014 | Isono et al. |
| 2014/0210033 A1 | 7/2014 | Yano et al. |
| 2014/0339606 A1 | 11/2014 | Lin et al. |
| 2015/0115382 A1 | 4/2015 | Wu et al. |
| 2015/0311248 A1 | 10/2015 | Lee et al. |
| 2016/0172417 A1 | 6/2016 | Chen et al. |
| 2017/0025460 A1 | 1/2017 | Chen et al. |
| 2018/0033820 A1 | 2/2018 | Chen et al. |
| 2019/0140001 A1 | 5/2019 | Chen et al. |

* cited by examiner

SEMICONDUCTOR IMAGE SENSOR DEVICE HAVING BACK SIDE ILLUMINATED IMAGE SENSORS WITH EMBEDDED COLOR FILTERS

PRIORITY DATA

The present application is a continuation application of U.S. application Ser. No. 16/220,362, filed Dec. 14, 2018, which is a continuation application of U.S. application Ser. No. 15/727,716, filed Oct. 9, 2017, which is a continuation application of U.S. application Ser. No. 15/284,790, filed Oct. 4, 2016, which is a continuation application of U.S. application Ser. No. 15/050,819, filed Feb. 23, 2016, which is a divisional application of U.S. application Ser. No. 14/261,472, filed Apr. 25, 2014, each of which is hereby incorporated by reference in its entirety.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels (which may include photodiodes and transistors) in a substrate to absorb (i.e., sense) radiation that is projected toward the substrate and convert the sensed radiation into electrical signals.

A back side illuminated (BSI) image sensor device is one type of image sensor device. These BSI image sensor devices are operable to detect light from the backside. Compared to front side illuminated (FSI) image sensor devices, BSI image sensor devices have improved performance, especially under low light conditions. However, traditional methods of fabricating BSI image sensor devices may still lead to certain shortcomings for BSI image sensor devices. For example, the fabrication of traditional BSI image sensors generally forms a color filter array on a flat surface above a light-blocking metal grid. However, the disposition of the color filter array above the metal grid leads to a longer optical path for the light before it can be detected by a desired pixel. The disposition of the color filter array above the metal grid also requires accurate alignment between the color filter array and the metal grid, as any misalignment may cause undesirable cross-talk between adjacent pixels.

Hence, while existing BSI image sensor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
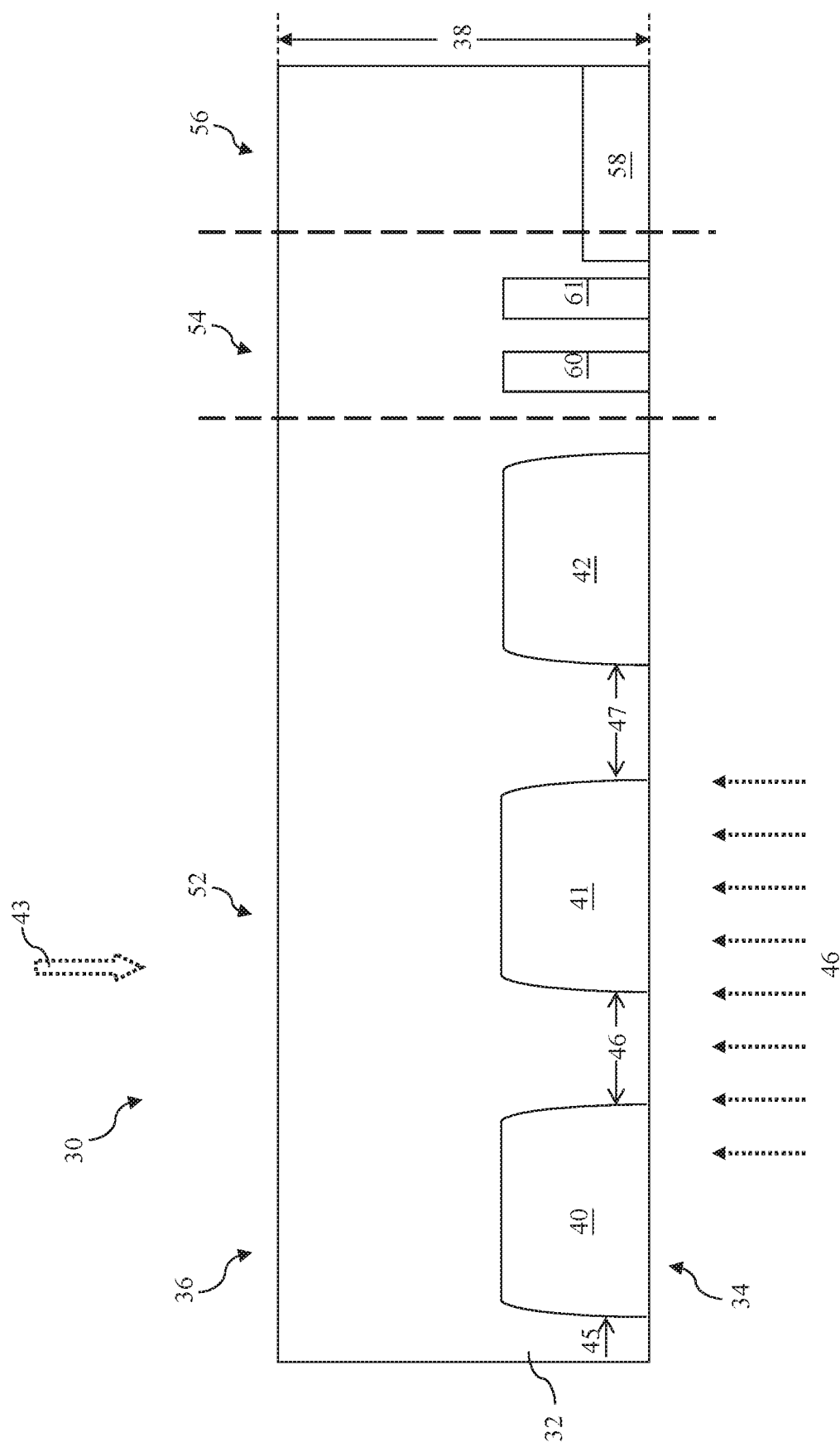
FIGS. 1, 2, 3, 4, 5, 6, 7, 8, 9, 10, 11, 12, and 13 are simplified fragmentary cross-sectional side views of a portion of an image sensor device at various stages of fabrication in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-13 are simplified diagrammatic fragmentary sectional side views a BSI image sensor device 30 at various stages of fabrication according to aspects of the present disclosure. The image sensor device 30 includes an array or grid of pixels for sensing and recording an intensity of radiation (such as light) directed toward a back-side of the image sensor device 30. The image sensor device 30 may include a charge-coupled device (CCD), complementary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 6 have been simplified for a better understanding of the inventive concepts of the present disclosure and may not be drawn to scale.

With reference to FIG. 1, the image sensor device 30 includes a device substrate 32. In the illustrated embodiment, the device substrate 32 contains a silicon material doped with a p-type dopant such as boron (for example a p-type substrate). Alternatively, the device substrate 32 could contain another suitable semiconductor material. For example, the device substrate 32 may include silicon that is doped with an n-type dopant such as phosphorous or arsenic (an n-type substrate). The device substrate 32 could also contain other elementary semiconductors such as germanium and diamond. The device substrate 32 could optionally include a compound semiconductor and/or an alloy semiconductor. Further, the device substrate 32 could include an epitaxial layer (epi layer), may be strained for performance enhancement, and may include a silicon-on-insulator (SOI) structure.

The device substrate 32 has a front side (also referred to as a front surface) 34 and a back side (also referred to as a back surface) 36. The device substrate 32 also has an initial thickness 38 that is in a range from about 100 microns (um)

to about 3000 um. In the present embodiment, the initial thickness 38 is in a range from about 500 um to about 1000 um.

Radiation-sensing regions—for example, pixels 40, 41, and 42—are formed in the device substrate 32. The pixels 40-42 are configured to sense radiation (or radiation waves), such as an incident light 43, that is projected toward device substrate 32 from the back side 36. The light 43 would enter the device substrate 32 through the back side 36 (or the back surface) and be detected by one or more of the pixels 40-42. The pixels 40-42 each include a photodiode in the present embodiment. In other embodiments, the pixels 40-42 may include pinned layer photodiodes, photogates, reset transistors, source follower transistors, and transfer transistors. The pixels 40-42 may also be referred to as radiation-detection devices or light-sensors.

The pixels 40-42 may be varied from one another to have different junction depths, thicknesses, widths, and so forth. For the sake of simplicity, only three pixels 40-42 are illustrated in FIG. 1, but it is understood that any number of pixels may be implemented in the device substrate 32. In the embodiment shown, the pixels 40-42 are formed by performing an implantation process 46 on the device substrate 32 from the front side 34. The implantation process 46 includes doping the device substrate 32 with a p-type dopant such as boron. In an alternative embodiment, the implantation process 46 may include doping the device substrate 32 with an n-type dopant such as phosphorous or arsenic. In other embodiments, the pixels 40-42 may also be formed by a diffusion process.

The pixels 40-42 are separated from one another by a plurality of gaps in the device substrate 32. For example, a gap 45 separates the pixel 40 from an adjacent pixel to its left (not illustrated), a gap 46 separates the pixels 40-41, and a gap 47 separates the pixels 41-42. Of course, it is understood that the gaps 45-47 are not voids or open spaces in the device substrate 32, but they are regions of the device substrate 32 that are located between the adjacent pixels 40-42.

Still referring to FIG. 1, the pixels 40-42 are formed in a region of the image sensor device 30 referred to as a pixel region 52 (or a pixel-array region). In addition to the pixel region 52, the image sensor 30 may also include a periphery region 54 and a bonding pad region 56. The dashed lines in FIG. 1 designate the approximate boundaries between the regions 52, 54, and 56, though it is understood that these regions 52, 54, and 56 are not drawn in scale herein and may extend vertically above and below the device substrate 32.

The periphery region 54 includes devices 60 and 61 that need to be kept optically dark. For example, the device 60 in the present embodiment may be a digital device, such as an application-specific integrated circuit (ASIC) device or a system-on-chip (SOC) device. The device 61 may be a reference pixel that is used to establish a baseline of an intensity of light for the image sensor device 30.

The bonding pad region 56 includes a region where one or more bonding pads (not illustrated herein) of the image sensor device 30 will be formed in a later processing stage, so that electrical connections between the image sensor device 30 and external devices may be established. Among other things, the bonding pad region 56 may contain an isolation structure, such as a shallow trench isolation (STI) 58. The STI 58 partially extends into the periphery region 54. One function of the STI 58 is that it helps insulate the silicon of the device substrate 32 from a conductive pad to be formed in the bonding pad region 56, which will be discussed below in more detail.

Although not illustrated herein for reasons of simplicity, it is understood that the image sensor 30 may also include a scribe line region. The scribe line region includes a region that separates one semiconductor die (for example, a semiconductor die that includes the bonding pad region 56, the periphery region 54, and the pixel region 52) from an adjacent semiconductor die (not illustrated). The scribe line region is cut therethrough in a later fabrication process to separate adjacent dies before the dies are packaged and sold as integrated circuit chips. The scribe line region is cut in such a way that the semiconductor devices in each die are not damaged.

Figure 2:
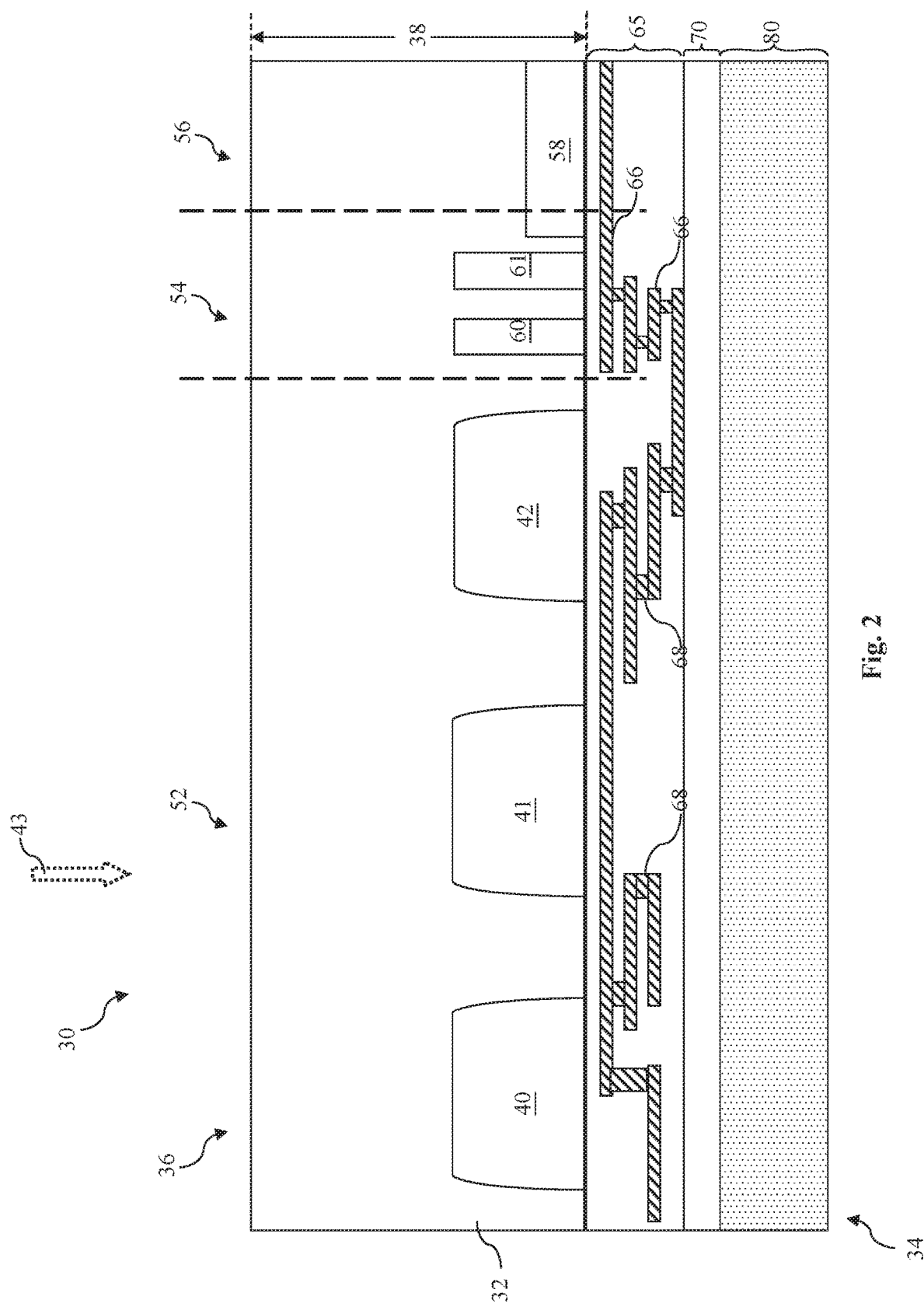

Referring now to FIG. 2, an interconnect structure 65 is formed over the front side 34 of the device substrate 32. The interconnect structure 65 includes a plurality of patterned dielectric layers and conductive layers that provide interconnections (e.g., wiring) between the various doped features, circuitry, and input/output of the image sensor device 30. The interconnect structure 65 includes an interlayer dielectric (ILD) and a multilayer interconnect (MLI) structure. The MLI structure includes contacts, vias and metal lines. For purposes of illustration, a plurality of conductive lines 66 and vias/contacts 68 are shown in FIG. 2, it being understood that the conductive lines 66 and vias/contacts 68 illustrated are merely exemplary, and the actual positioning and configuration of the conductive lines 66 and vias/contacts 68 may vary depending on design needs.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 68) and horizontal connection (for example, conductive lines 66). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 2, a buffer layer 70 is formed over the front side 34 of the interconnect structure 80. In the present embodiment, the buffer layer 70 includes a dielectric material such as silicon oxide. Alternatively, the buffer layer 70 may optionally include silicon nitride. The buffer layer 70 may be formed by CVD, PVD, or other suitable techniques. The buffer layer 70 is planarized to form a smooth surface by a CMP process.

Thereafter, a carrier substrate 80 is bonded with the device substrate 40 through the buffer layer 100 and the interconnect structure 65, so that processing of the back side 36 of the device substrate 32 can be performed. The carrier substrate 80 in the present embodiment is similar to the device substrate 32 and includes a silicon material. Alternatively, the carrier substrate 80 may include a glass substrate or another suitable material. The carrier substrate 80 may be bonded to the device substrate 32 by molecular forces—a technique known as direct bonding or optical fusion bonding—or by other bonding techniques known in the art, such as metal diffusion or anodic bonding.

Among other things, the buffer layer 70 provides electrical isolation between the device substrate 32 and the carrier substrate 80. The carrier substrate 80 provides protection for the various features formed on the front side 34 of the device substrate 32, such as the pixels 40-42 formed therein. The carrier substrate 80 also provides mechanical strength and support for processing of the back side 36 of the device substrate 32 as discussed below. After bonding, the device substrate 32 and the carrier substrate 80 may optionally be annealed to enhance bonding strength.

Figure 3:
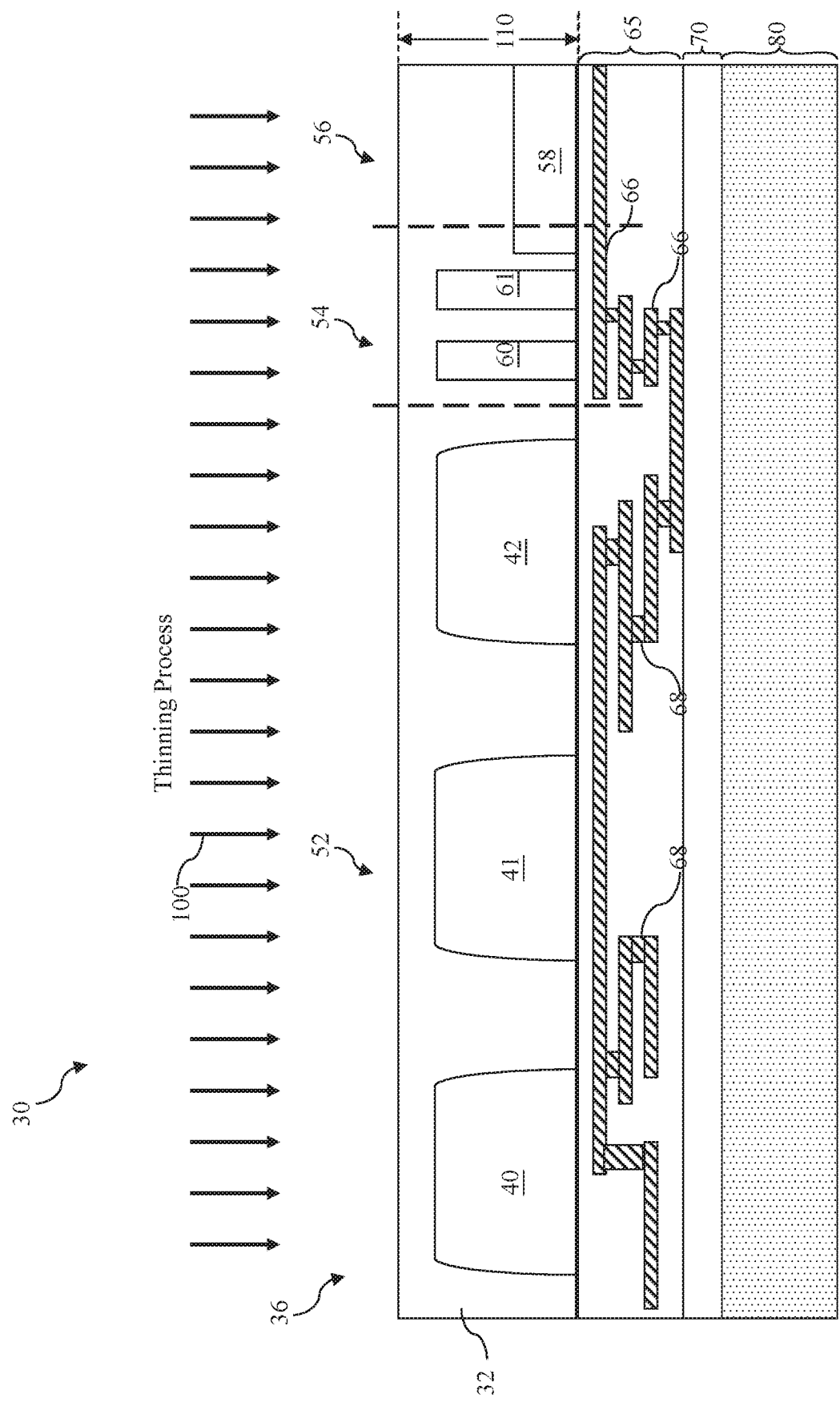

Referring now to FIG. 3, after the carrier substrate 80 is bonded to the device substrate 32, a thinning process 100 is then performed to thin the device substrate 32 from the backside 36. The thinning process 100 may include a mechanical grinding process and a chemical thinning process. A substantial amount of substrate material may be first removed from the device substrate 32 during the mechanical grinding process. Afterwards, the chemical thinning process may apply an etching chemical to the back side 36 of the device substrate 32 to further thin the device substrate 32 to a thickness 110, which is on the order of a few microns. In some embodiments, the thickness 110 is greater than about 1 um but less than about 3 um. It is also understood that the particular thicknesses disclosed in the present disclosure are mere examples and that other thicknesses may be implemented depending on the type of application and design requirements of the image sensor device 30.

Figure 4:
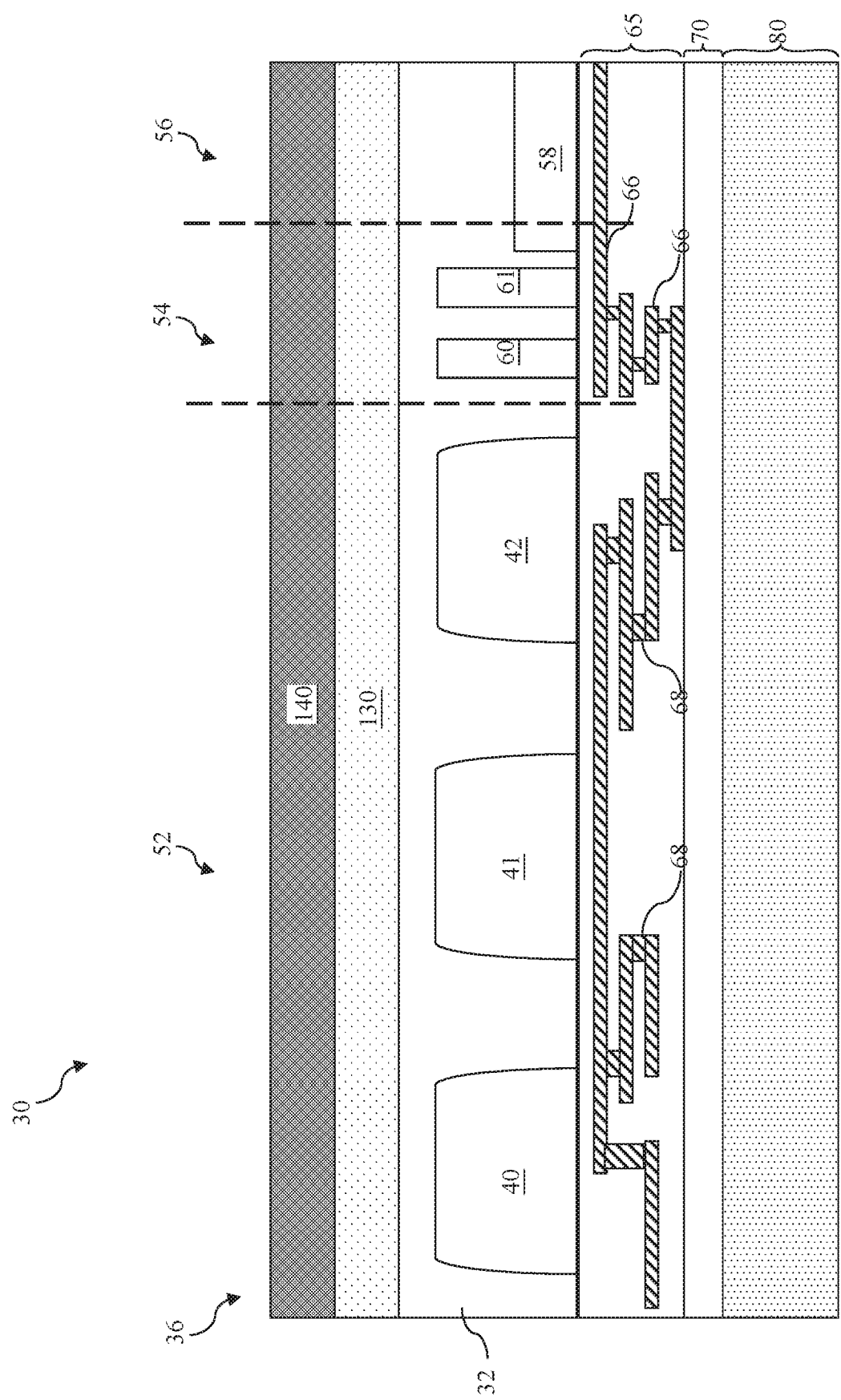

Referring now to FIG. 4, an anti-reflective coating (ARC) layer 130 is formed over the back side 36 of the device substrate 32. In some embodiments, the ARC layer 130 contains a high-k material. In other embodiments, the ARC layer 130 may contain another suitable anti-reflective material. A buffer layer 140 is formed over the ARC layer 130. In some embodiments, the buffer layer 140 contains silicon oxide. In other embodiments, the buffer layer 140 may contain another suitable material, for example another type of dielectric material. The ARC layer 130 and the buffer layer 140 may each be formed via one or more deposition processes known in the art.

Figure 5:
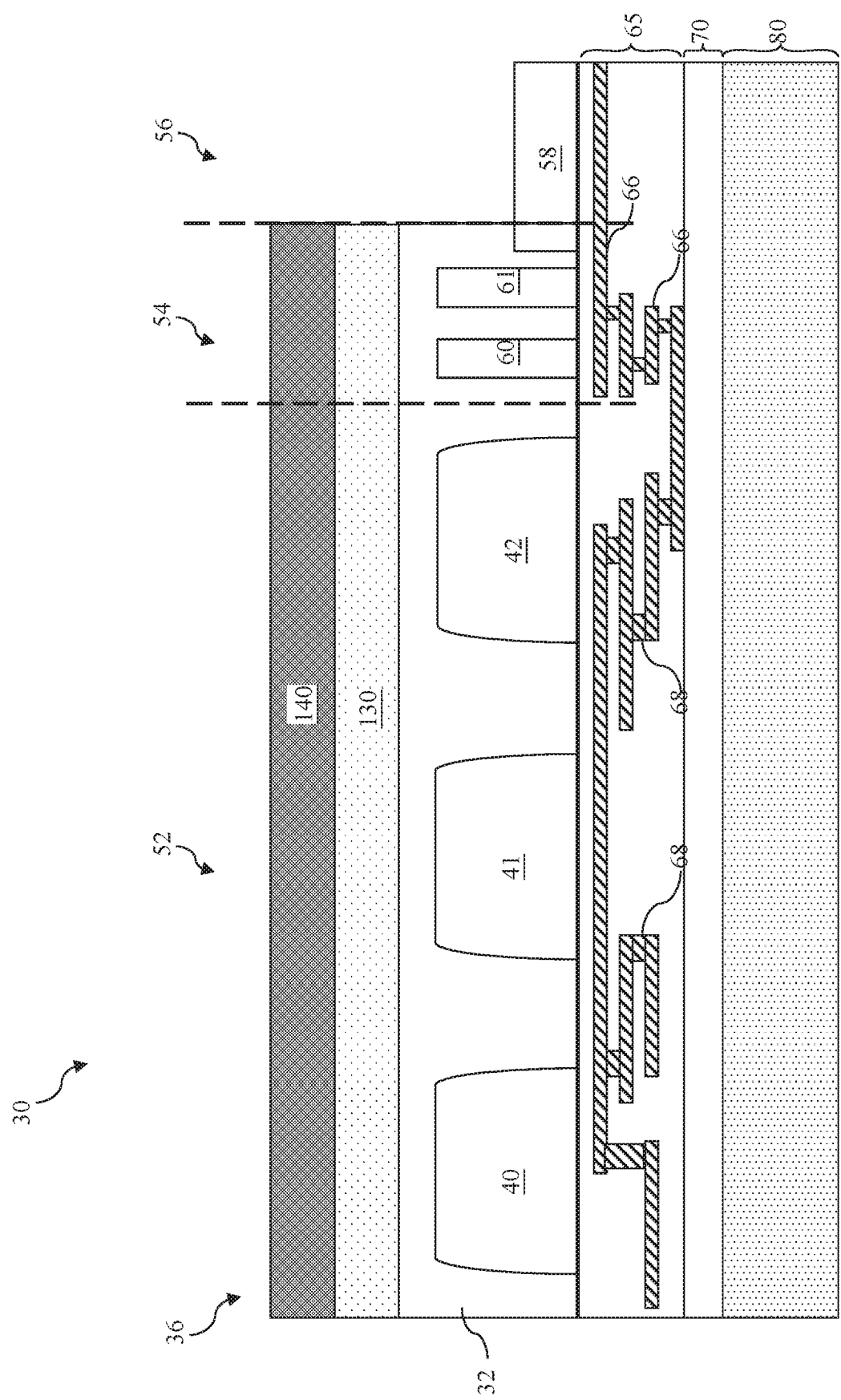

Referring now to FIG. 5, the bonding pad region 56 is "opened." In more detail, one or more etching processes may be performed to remove portions of the buffer layer 140, the ARC layer 130, and the substrate 32 in the bonding pad region 56, until the STI 58 is exposed. Meanwhile, the pixel region 52 and the periphery region 54 remain substantially un-etched.

Figure 6:
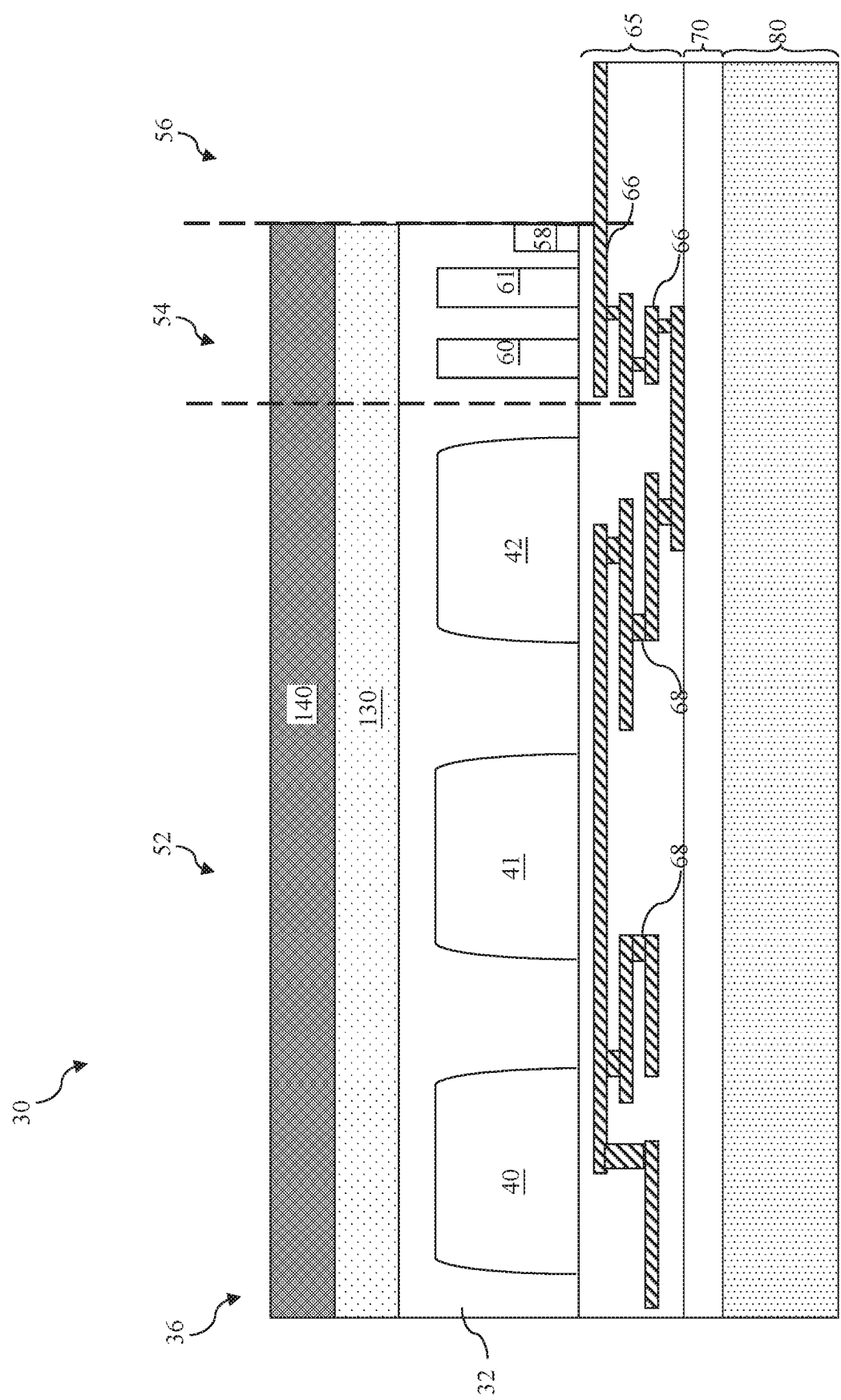

Referring now to FIG. 6, the STI 58 in the bonding pad region 56 is removed, for example by one or more etching processes. However, a portion of the STI 58 still remains in the periphery region 54, since the periphery region 54 is not etched. A portion of the interlayer dielectric material is also removed in the bonding pad region 56, for example by one or more etching processes. The removal of the STI 58 and the removal of the interlayer dielectric material in the bonding pad region 56 allows one of the conductive lines to be exposed in the bonding pad region 56.

Figure 7:
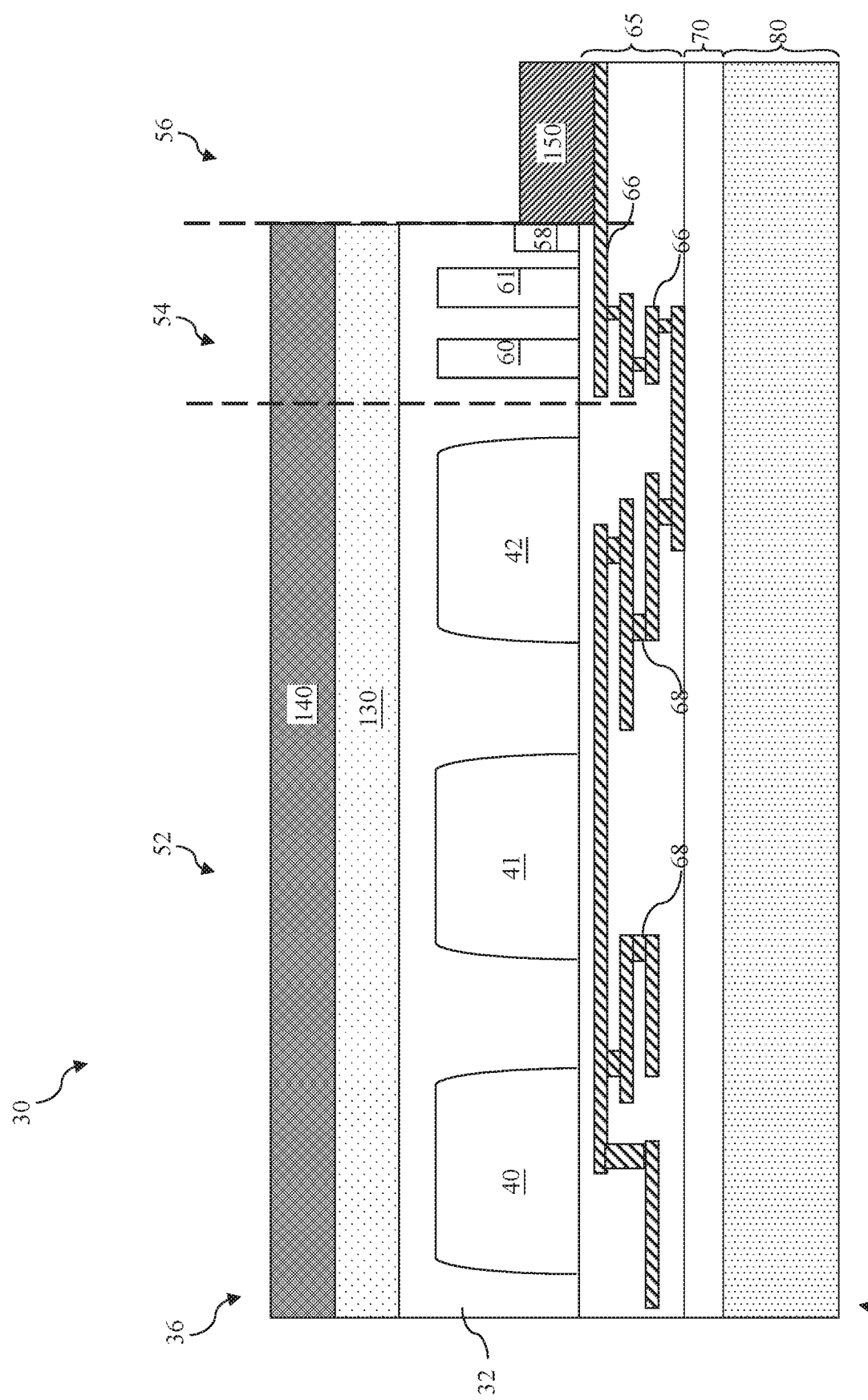

Referring now to FIG. 7, a conductive pad 150 is formed on the exposed surface of the conductive line 66 in the bonding pad region 56. The conductive pad 150 may be formed by one or more deposition and patterning processes. In some embodiments, the conductive pad 150 contains aluminum. In other embodiments, the conductive pad 150 may contain another suitable metal, for example copper. A bonding wire (or another electrical interconnection element) may be attached to the conductive pad 150 in a later process, and accordingly the conductive pad 150 may also be referred to as a bond pad or a bonding pad. Also, since the conductive pad 150 is formed on the conductive line 66, it is electrically coupled to the conductive line 66 and the rest of the interconnect structure 65 through the conductive line 66. In other words, electrical connections may be established between external device and the image sensor device 30 at least in part through the conductive pad 150.

In the illustrated embodiments of the present disclosure, the conductive pad 150 is also formed to be no higher (relative to the back side 36) than an upper surface of the portion of the STI 58 that is disposed in the periphery region 54, such that the upper surface of the STI 58 is located closer to the back side 36 of the image sensor device 30 than an upper surface of the conductive pad 150. Stated differently, the upper surface of the conductive pad 150 is at the same level or below the upper surface of the STI 58 in the periphery region 54. This is to prevent the device substrate 32 (in the periphery region 54) from coming into direct physical contact with the conductive pad 150. Had the conductive pad 150 been formed to be taller than the STI 58 in the periphery region, a portion of the device substrate 32 would have come into direct physical contact with the conductive pad 150, which may result in undesirable metal diffusion. Here, by forming the conductive pad 150 to be lower than the portion of the STI 58, the conductive pad 150 is insulated from the device substrate 32 by the portion of the STI 58 in the periphery region 54, thereby preventing metal diffusion. The conductive pad 150 is formed to have a thickness 160. In some embodiments, to ensure that the conductive pad 150 can adequately handle the bonding processes to be performed later, the thickness 160 is formed to be in a range from about 0.8 microns to about 4 microns.

Figure 8:
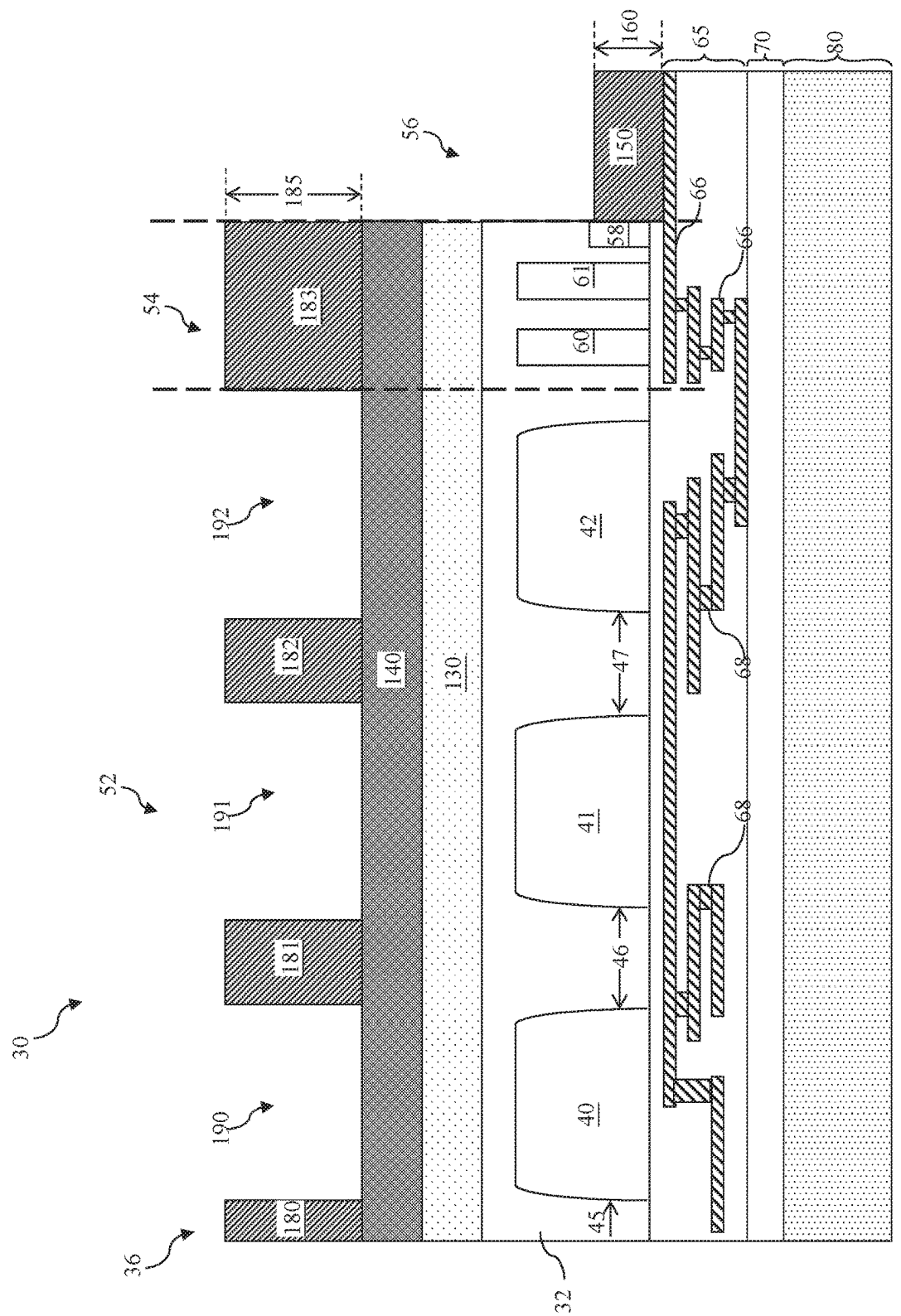

Referring now to FIG. 8, a plurality of light-blocking structures 180-183 (also referred to as light-reflective structures) is formed over the buffer layer 140. The light-blocking structures 180-183 may be formed by one or more deposition and patterning processes. In various embodiments, the light-blocking structures 180-183 may contain a metal material, such as aluminum. In other embodiments, different types of light-blocking or light-reflective materials may be used to implement the light-blocking structures 180-183, for example silver, chromium, tungsten, nickel, etc.

As examples, the light-blocking structures 180-182 are formed in the pixel region 52, where each of the light-blocking structures 180-182 is vertically aligned with a respective one of the gaps 45-47 that separate adjacent pixels 40-42. For example, the light-blocking structure 180 is vertically aligned with the gap 45 that separates the pixel 40 from the pixel located to its left (not illustrated herein), the light-blocking structure 181 is vertically aligned with the gap 46 that separates the pixels 40 and 41, and the light-blocking structure 182 is vertically aligned with the gap 47 that separates the pixels 41 and 42.

In this manner, the light-blocking structures 180-182 reduce cross-talk. In more detail, cross-talk may arise when light targeted for one pixel (e.g., pixel 41) spreads to one or more neighboring pixels (e.g., pixels 40 or 42). Cross-talk will negatively affect image sensor performance, such as degradation of spatial resolution, reduction of overall optical sensitivity, and poor color separation. Therefore, the light-blocking structures 180-182 are implemented between neighboring pixels, so that light that would have incorrectly traveled to an adjacent pixel will be blocked and/or reflected back by the light-blocking structures 180-182, thereby reducing cross-talk.

The light-blocking structure 183 is formed in the periphery region 54. The light-blocking structures 183 may substantially block light from reaching the digital device 60 or the reference pixel 61 that are supposed to be kept optically dark.

The light-blocking structures 180-183 are formed to have a thickness 185. In some embodiments, to ensure that the light-blocking structures 180-183 can sufficiently block light, the thickness 185 is formed to be in a range from about 0.1 microns to about 5 microns.

It can be seen that the light-blocking structures 180-183 and the buffer layer 140 therebelow collectively define a plurality of openings 190-192. These openings 190-192 are reserved for the formation of a color filter array. In other words, a plurality of color filters will be formed to fill the openings 190-192, respectively (as discussed below in more detail with reference to FIG. 11).

Still referring to FIG. 8, it is understood that the formation of the light-blocking structures 180-183 (i.e., the metal grid) after the formation of the conductive pad 150 is a unique fabrication process flow according to embodiments of the present disclosure. In conventional image sensor fabrication process flows, a metal grid structure is typically formed before a conductive bonding pad is formed. The unique fabrication process flow herein offers certain advantages that will be discussed below in more detail.

Figure 9:
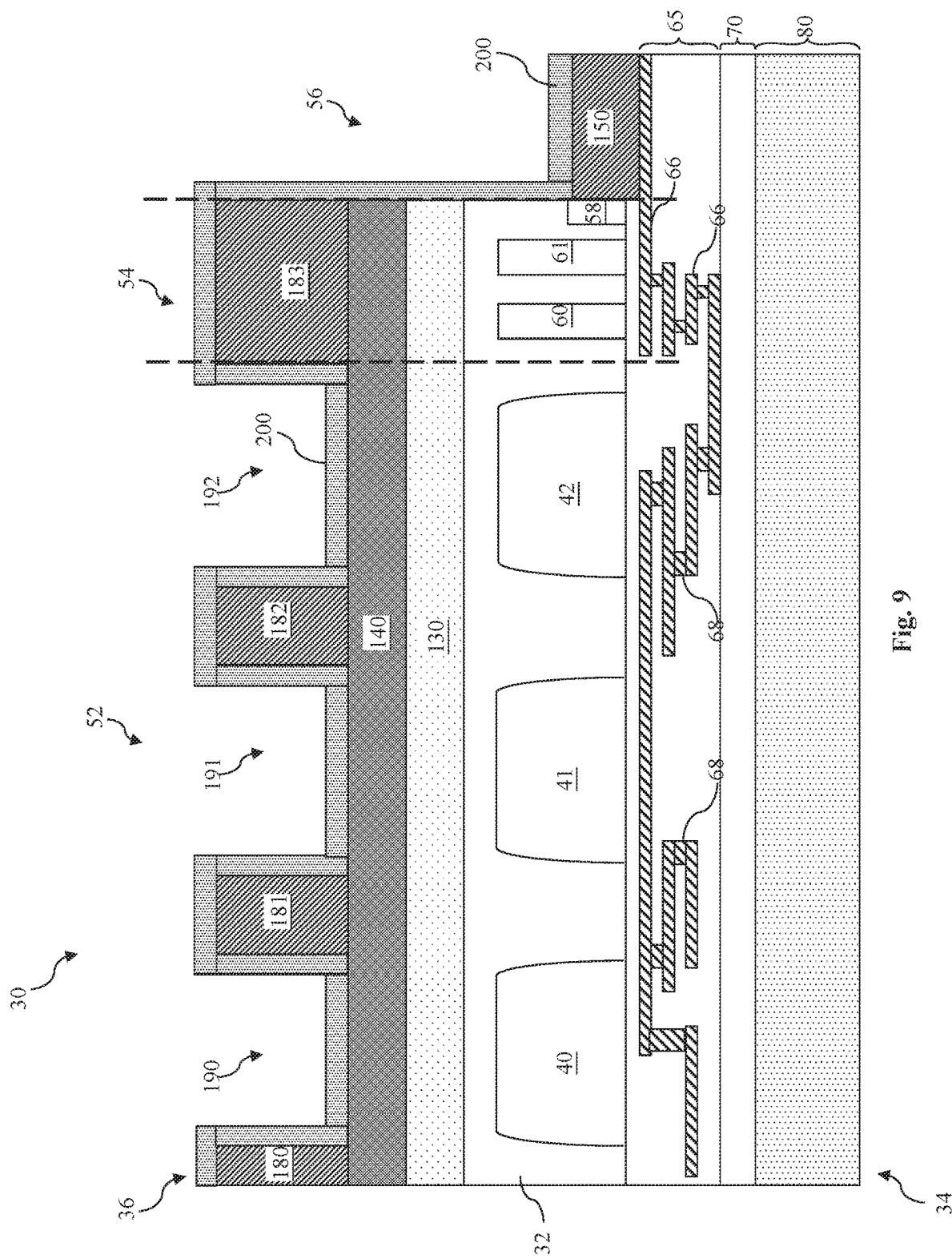

Referring now to FIG. 9, a passivation layer 200 is formed. The passivation layer 200 may be formed by a suitable deposition process known in the art. The passivation layer 200 is formed over the conductive pad 150 in the bonding pad region 56, on the sidewalls of the device substrate 32 and the layers 130-140 in the periphery region 54, and around each of the light-blocking structures 180-183 and on the exposed surfaces of the buffer layer 140 in the pixel region 52. The passivation layer 200 protects the various layers therebelow from elements such as dust, moisture, etc. In some embodiments, the passivation layer 200 contains a dielectric material, such as silicon oxide, silicon nitride, silicon oxynitride, etc. In some embodiments, the passivation layer 200 is formed in a conformal manner.

Figure 10:
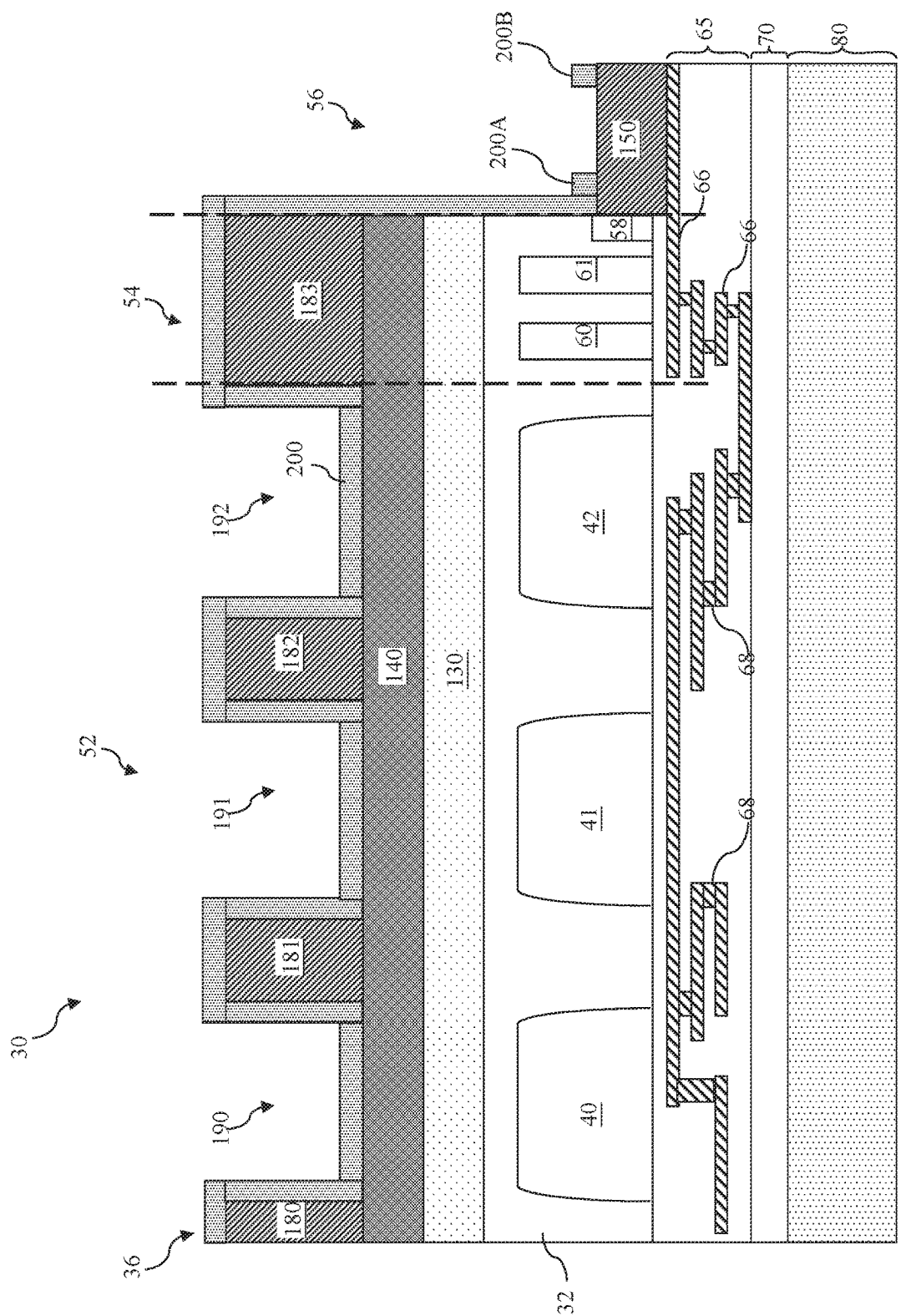

Referring now to FIG. 10, a portion of the passivation layer 200 in the bonding pad region 56 is removed, for example through one or more etching processes. The partial removal of the passivation layer 200 in the bonding pad region 56 exposes a portion of the conductive pad 150 in the bonding pad region 56. Note that the removal of the passivation layer 200 is performed in a manner such that portions of the passivation layer 200 (such as portions 200A and 200B) still remain on the conductive pad 150 in the bonding pad region 56 even after the portion of the passivation layer 200 has been removed. This is because there is no reason to completely remove the passivation layer 200 in the bonding pad region 56. For example, the removal of the passivation layer 200 (i.e., the "opening" of the passivation layer 200) merely needs to be performed to ensure that the exposed surface of the conductive pad 150 is sufficiently wide to receive a bonding wire. As such, it would have placed an unnecessarily high burden on the fabrication processes to completely remove the passivation layer 200 in the bonding pad region 56. In addition, complete removal of the passivation layer 200 in the bonding pad region 56 may also lead to the erosion or inadvertent removal of the passivation layer 200 where it is desired, such as on the sidewall surfaces of the device substrate 32, the layers 130-140, and on the light-blocking structure 183.

For these reasons discussed above, the portions 200A-200B of the passivation layer will remain on the conductive pad 150, and the presence of the portions 200A-200B of the passivation layer in the bonding pad region 56 is one of the unique observable characteristics of the present disclosure. Stated differently, the disposition of the remnant portions 200A-200B of the passivation layer in the bonding pad region 56 is not necessarily intentional or deliberate, as these remnant portions 200A-200B of the passivation layer may or may not serve any specific functional or structural purposes. Rather, the presence of the remnant portions 200A-200B of the passivation layer is a byproduct of the unique fabrication process flow of the present disclosure, in which the conductive pad 150 is formed before the light-blocking structures 180-183 are formed.

Figure 11:
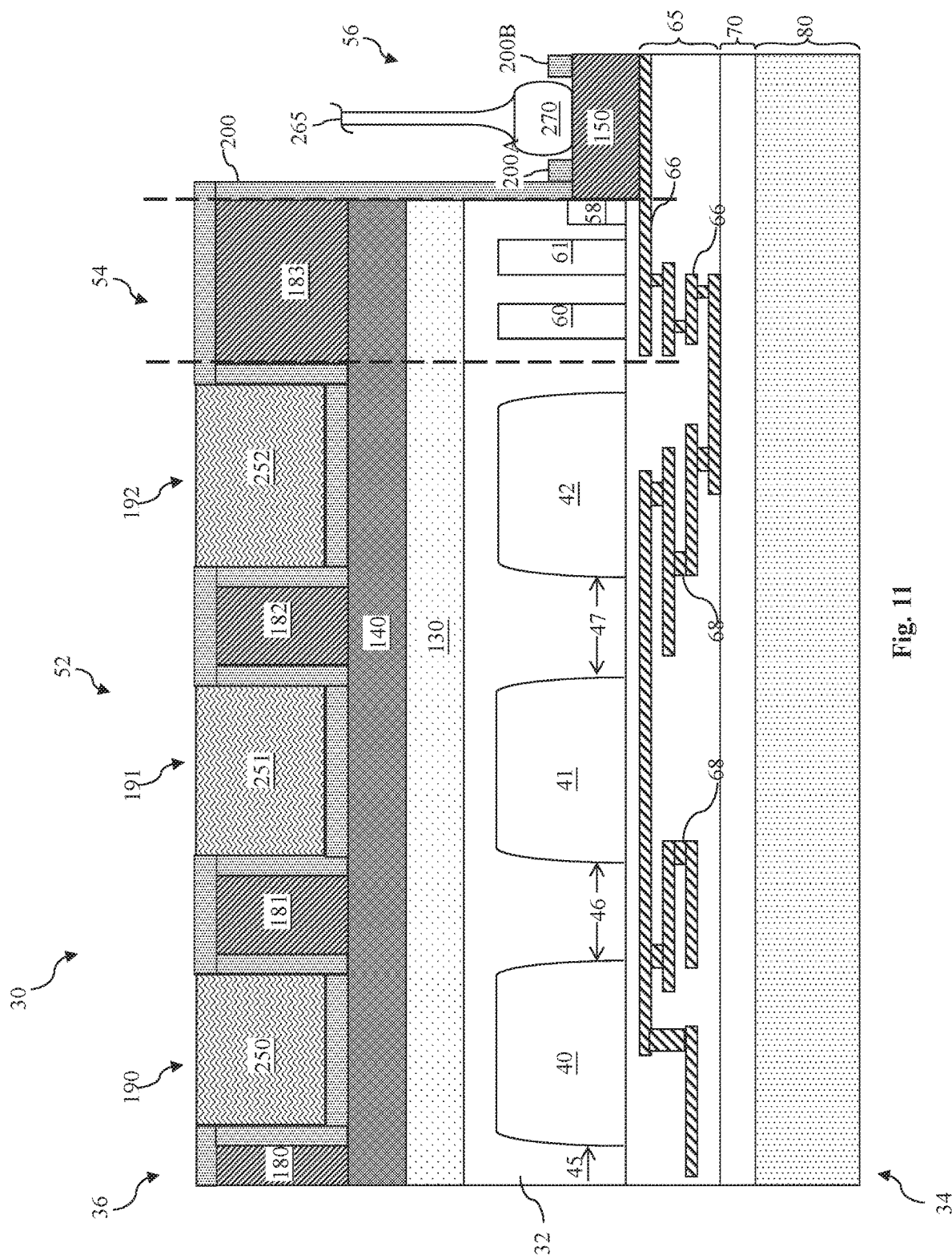

Referring now to FIG. 11, a plurality of color filters 250-252 is formed in the openings 190-192, respectively. In some embodiments, the color filters 250-252 may contain an organic material and may be formed by one or more coating and lithography processes. The color filters 250-252 may also be associated with different colors. For example, the color filter 250 may allow a red light to pass through but will filter out all the other colors of light, the color filter 251 may allow a green light to pass through but will filter out all the other colors of light, and the color filter 252 may allow a blue light to pass through but will filter out all the other colors of light.

The color filters 250-252 may be referred to as buried color filters (or a buried color filter array), since they are buried or embedded in the openings 190-192 defined by the light-blocking structures 180-183, rather than being formed over or above the light-blocking structures 180-183. In this manner, the color filters 250-252 are also vertically aligned with the pixels 40-42, respectively. In other words, the alignment between the color filters 250-252 and the pixels 40-42 is attributed at least in part to the fact that the light-blocking structures 180-182 are vertically aligned with the gaps 45-47 separating the neighboring pixels. As such, it may also be said that the color filters 250-252 are "self-aligned" with the pixels 40-42. Again, the self-aligned color filters 250-252 of the present disclosure improve the cross-talk performance of the image sensor device 30. Furthermore, the fact that the color filters 250-252 are now "buried" or "embedded" in the openings 190-192 also results in shorter optical paths between the color filters 250-252 and the pixels 40-42, which improves the reception of the light in the pixels 40-42.

A bonding wire 265 is also attached to the conductive pad 150 in the bonding pad region 56. The bonding wire 265 may be attached using a wire bonding process known in the art. The wire bonding process may include a ball bonding process, in which a portion of the bonding wire 265 is melted to form a bonding ball 270. In one embodiment, the bonding wire 265 and the bonding ball 270 each include gold. In other embodiments, the bonding wire 265 and the bonding ball 270 may include copper or another suitable metal. The bonding ball 270 has a lateral dimension that is smaller than a lateral dimension than the exposed surface of the conductive pad 150.

In the fabrication process flow discussed above with reference to FIGS. 1-11, the passivation layer 200 is first "opened" in the bonding pad region 56 to expose the conductive pad 150, and then the color filters 250-252 are formed. This may be referred to as a "pad-first" process flow. Alternatively, the color filters 250-252 may be formed first, and the passivation layer 200 may then be "opened" in the bonding pad region 56 to expose the conductive pad 150. This is referred to as a "pad-last" process flow, as discussed briefly below with reference to FIGS. 12-13.

Figure 12:
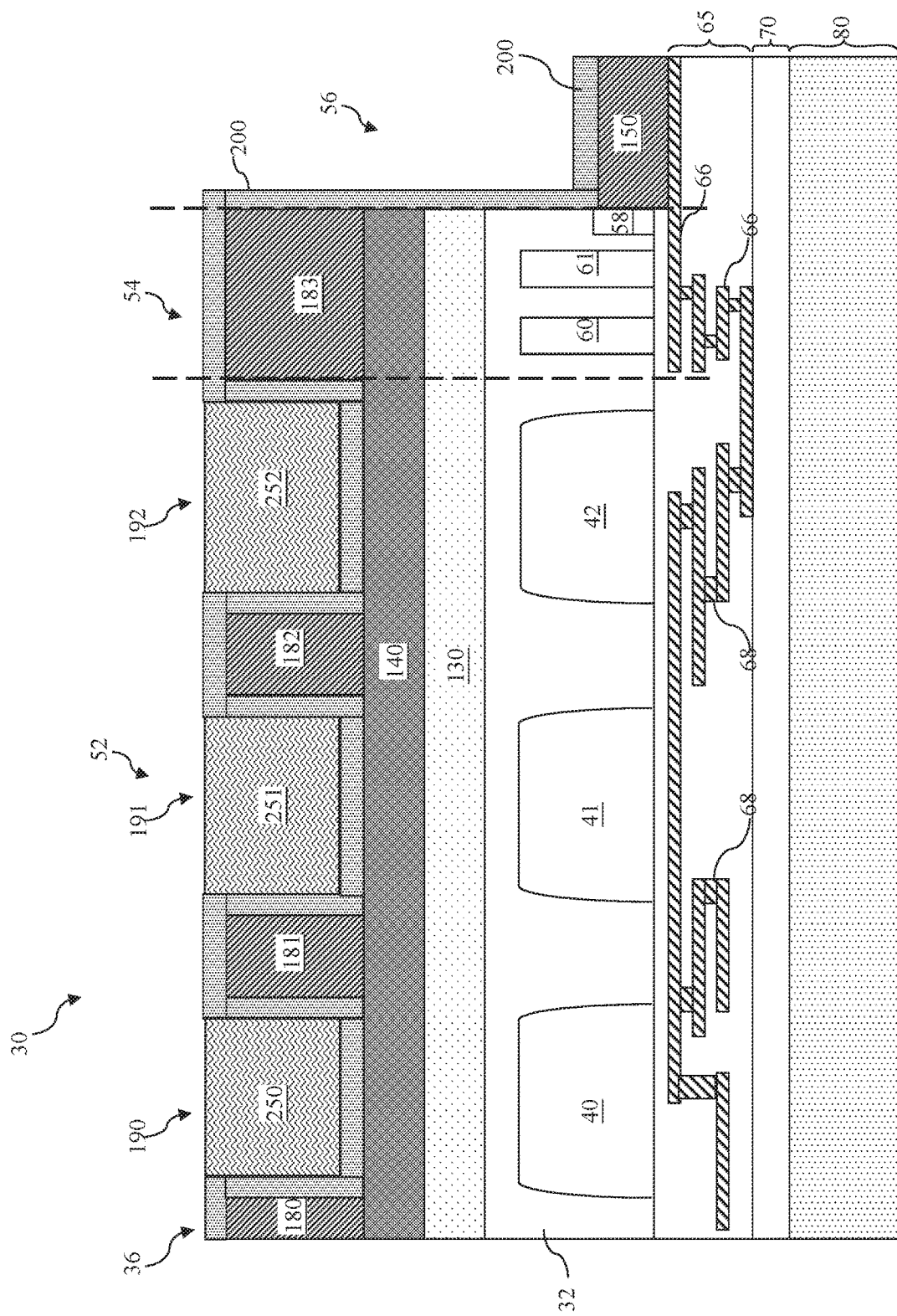

Referring to FIG. 12, the passivation layer 200 has been formed over the back side 36 of the image sensor device 30, as is done in the "pad-first" process flow discussed above with reference to FIG. 9. However, instead of removing a portion of the passivation layer 200 in the bonding pad region 56 to expose a part of the conductive pad 150, the color filters 250-252 are formed to fill the openings 190-192 first. Stated differently, the color filters 190-192 are formed before the conductive pad 150 is exposed.

Figure 13:
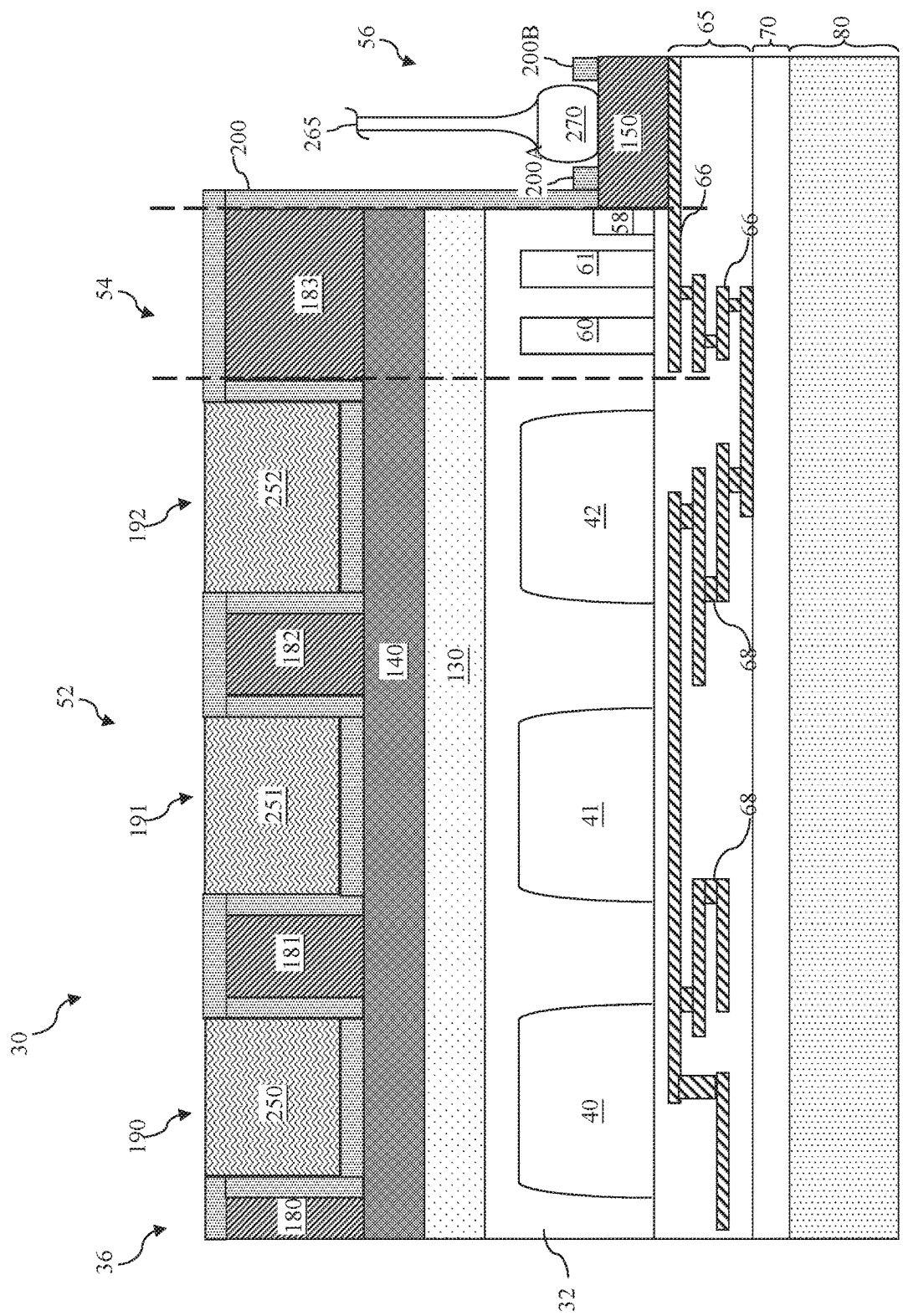

Referring now to FIG. 13, after the formation of the color filters 250-252, the bonding pad region 56 is "opened." That is, a portion of the conductive pad 150 is exposed by removing a portion of the passivation layer 200 thereabove, for example through one or more etching processes known in the art. Thereafter, the bonding wire 265 may be attached to the exposed portion of the conductive pad 150.

Although not specifically illustrate, it is understood that additional processes may be performed to complete the fabrication of the image sensor device 30. For example, a plurality of micro-lenses may be formed over the color filters 250-252. The micro-lenses help direct and focus light towards the pixels 40-42 in the substrate 32. The micro-lenses may be positioned in various arrangements and have various shapes depending on a refractive index of material used for the micro-lens and distance from a sensor surface. In addition, a plurality of testing, dicing, and packaging processes may also be performed. For reasons of simplicity, these additional structures and/or processes are not specifically illustrated or discussed in detail herein.

Figure 14:
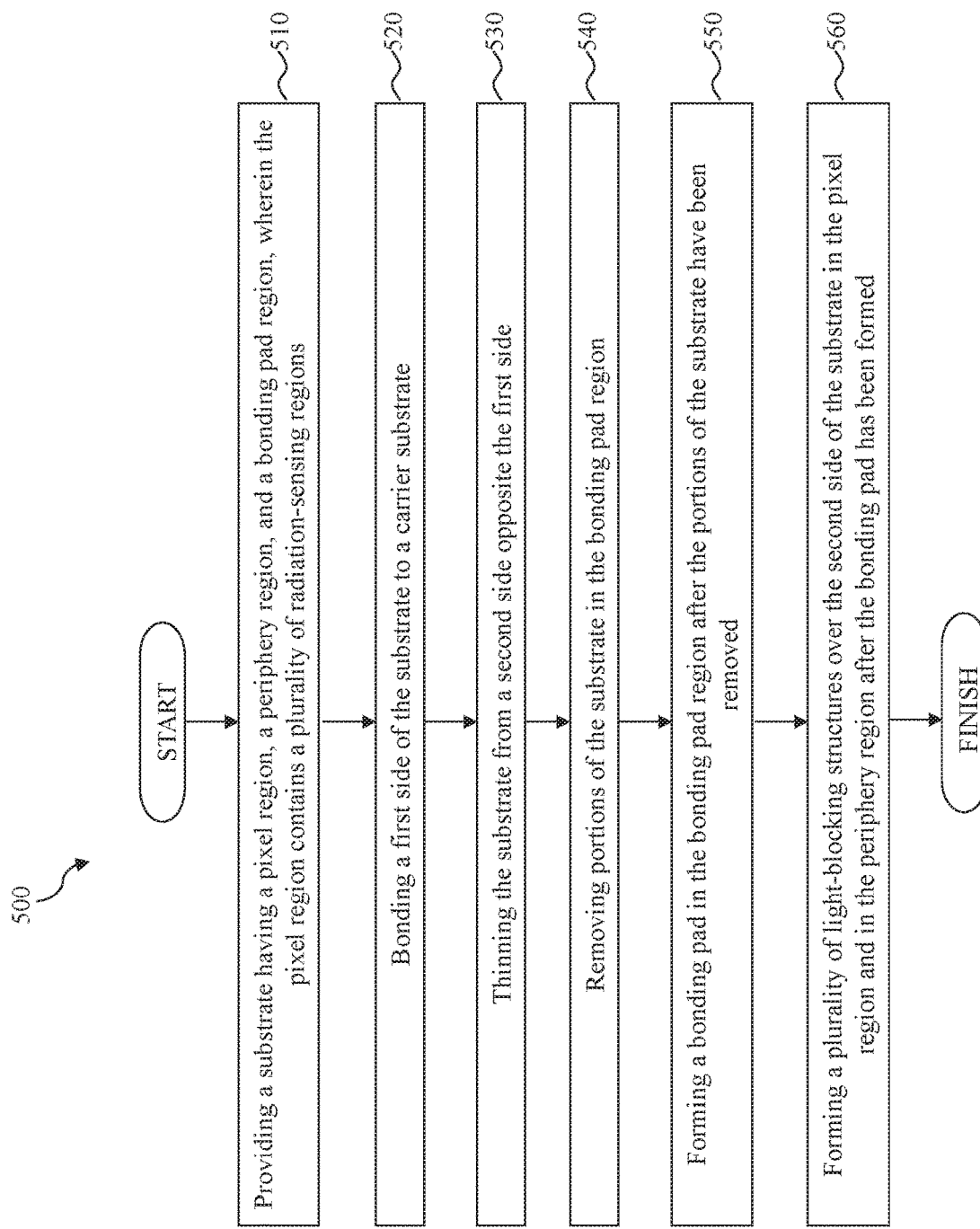
FIG. 14 is a flowchart illustrating a method of fabricating an image sensor device in accordance with some embodiments.

FIG. 14 is a simplified flowchart illustrating a method 500 of fabricating an image sensor device according to embodiments of the present disclosure. The method 500 includes a step 510 of providing a substrate that contains a plurality of radiation-sensing regions formed therein. The substrate has a first side and a second side. An interconnect structure may be formed over the first side of the substrate. The substrate (or the semiconductor image sensor device) has a pixel region, a periphery region, and a bonding pad region. The radiation-sensing regions are formed in the pixel region.

The method 500 includes a step 520 of bonding the first side of the substrate to a carrier substrate. The step 520 is performed such that the interconnect structure is bonded between the substrate and the carrier substrate.

The method 500 includes a step 530 of thinning the substrate from the second side after the bonding. In some embodiments, the thinning step 530 includes one or more chemical and/or mechanical grinding and polishing processes.

The method 500 includes a step 540 of removing portions of the substrate in the bonding pad region.

The method 500 includes a step 550 of forming a bonding pad in the bonding pad region after the portions of the substrate have been removed.

The method 500 includes a step 560 of forming a plurality of light-blocking structures over the second side of the substrate in the pixel region and in the periphery region after the bonding pad has been formed. The light-blocking structures may also be referred to as a metal grid.

It is understood that additional process steps may be performed before, during, or after the steps 510-560 discussed above to complete the fabrication of the semiconductor device. For example, a passivation layer may be over the second side of the substrate after the light-blocking structures have been formed, wherein the passivation layer is formed on the light-blocking structures and on the bonding pad. Thereafter, a portion of the passivation layer disposed on the bonding pad may be removed, thereby exposing a portion of the bonding pad, though remnants of the passivation layer may still remain on the bonding pad. A bonding wire may be attached to the bonding pad through the exposed surface of the bonding pad. A plurality of color filters may also be formed between the light-blocking structures. In some embodiments, before the step 540 of removing the substrate in the bonding pad region is performed, an antireflective coating (ARC) layer may be formed over the second side of the substrate, and a buffer layer may be formed over the ARC layer. The light-blocking structures are formed over the buffer layer. Additional steps may be performed to complete the image sensor fabrication, but they are not specifically discussed herein for reasons of simplicity.

The embodiments of the present disclosure discussed above offer advantages over existing art, though it is understood that different embodiments may offer other advantages, not all advantages are necessarily discussed herein, and that no particular advantage is required for all embodiments. In more detail, conventional BSI image sensor fabrication process flows typically form a metal grid (i.e., light-blocking or light-reflective structures) in the back side before a conductive bonding pad is formed. The metal grid needs to be capped by a capping layer such as an oxide layer. This capping layer has to be flattened in subsequent processes, and it will be difficult to remove this capping layer over the metal grid before the bonding pad is formed. As a result, color filters have to be coated over a flat surface of the capping layer. In other words, the conventional fabrication process flow for BSI image sensors lead to the color filters being formed over and above the metal grid, rather than being embedded within the trenches or openings partially defined by the metal grid. As such, the conventional BSI image sensors have a longer optical path between the color filters and pixels, as well as gaps between the color filters and the metal grid from which light can escape. Moreover, the disposition of the color filters over and above the metal grid requires the metal grid to be accurately aligned with the color filters (or more precisely, the gaps separating adjacent color filters). For these reasons discussed above, conventional image sensors tend to suffer from cross-talk issues and/or have degraded performance in terms of optical loss or quantum efficiency.

In contrast, the present disclosure employs a unique fabrication process flow in which a conductive bonding pad is formed in a bonding pad region of the BSI image sensor device before the metal grid (i.e., the light-blocking structures) is formed over the back side. This approach allows the metal grid to define openings in which the color filters are formed. Stated differently, according to embodiments of the present disclosure, the color filters are formed to be embedded or buried in the openings defined by the metal grid, rather than being formed on a flat surface above the metal grid. Consequently, the metal grid can more effectively prevent the light from incorrectly entering an adjacent pixel (since the metal grid is at the same level as the color filters), thereby reducing cross-talk. The fact that the color filters are formed within the openings defined by the metal grid also means that the color filters are "self-aligned", thereby obviating any alignment constraints between the metal grid and the color filters. In addition, the shorter optical path between the color filters and the pixels increases light reception and enhances quantum efficiency. Furthermore, the various steps of the embodiments of the present disclosure are compatible with a pad-last approach, in which the passivation layer can be "opened" in the bonding pad region after the color filters are formed.

One embodiment of the present disclosure pertains to a semiconductor image sensor device. The image sensor device includes a substrate having a first side and a second side that is opposite the first side. An interconnect structure is disposed over the first side of the substrate. A plurality of radiation-sensing regions is located in the substrate. The radiation-sensing regions are configured to sense radiation that enters the substrate from the second side. The radiation-sensing regions are separated by a plurality of gaps. A plurality of radiation-blocking structures is disposed over the second side of the substrate. Each of the radiation-blocking structures is aligned with a respective one of the gaps.

Another embodiment of the present disclosure pertains to a semiconductor image sensor device. The image sensor device includes a substrate having a front side and a back side that is opposite the front side. An interconnect structure is disposed over the first side of the substrate. A plurality of pixels is located in the substrate. The pixels are each configured to detect light that enters the substrate from the back side. One or more layers are disposed over the back side of the substrate. A plurality of light-reflective structures is disposed over the one or more layers. The light-blocking structures are each vertically aligned with a respective portion of the substrate located between two adjacent pixels. The one or more layers and the plurality of light-reflective structures collectively define a plurality of openings. A plurality of color filters are disposed in the openings.

Yet another embodiment of the present disclosure pertains to a method of fabricating a semiconductor image sensor device. A substrate is provided. The substrate comprises a pixel region, a periphery region, and a bonding pad region. The pixel region contains a plurality of radiation-sensing regions. The first side of the substrate is bonded to a carrier substrate. Thereafter, the substrate is thinned from a second side opposite the first side. Portions of the substrate are removed in the bonding pad region. A bonding pad is formed in the bonding pad region after the portions of the substrate have been removed. A plurality of light-blocking structures is formed over the second side of the substrate in the pixel region and in the periphery region after the bonding pad has been formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate having a first side and a second side that is opposite the first side;
an interconnect structure disposed over the first side of the substrate;
a first pixel disposed in the substrate;
an anti-reflective coating layer disposed over the second side of the substrate;
a buffer layer disposed on the anti-reflective coating layer;
a radiation-blocking structure disposed on the buffer layer, wherein the radiation-blocking structure includes a first portion and a second portion;
a passivation layer disposed on the radiation-blocking structure;
a dielectric isolation structure disposed within the substrate, wherein the passivation layer extends to the dielectric isolation structure disposed within the substrate;
a color filter disposed on the passivation layer; and
wherein the first pixel is disposed within the substrate between the first and second portions of the radiation-blocking structure.

2. The device of claim 1, further comprising a bond pad interfacing with a portion of the interconnect structure, and wherein the passivation layer extends to the bond pad.

3. The device of claim 1, wherein a third portion of the radiation-blocking structure is disposed directly over the dielectric isolation structure thereby preventing light from reaching the dielectric isolation structure.

4. The device of claim 1, wherein the anti-reflective coating layer include a high-k dielectric layer and the buffer layer includes an oxide material.

5. The device of claim 1, wherein the radiation-blocking structure includes a metal material, and
wherein the passivation layer includes a dielectric material selected from the group consisting of silicon oxide, silicon nitride and silicon oxynitride.

6. The device of claim 1, further comprising a second pixel is disposed within the substrate, and
wherein the radiation-blocking structure further includes a third portion, and
wherein the second pixel is disposed within the substrate between the second and third portions of the radiation-blocking structure.

7. A device comprising:
a substrate having a front side and a back side that is opposite the front side;
an interconnect structure disposed over the front side of the substrate;
a first pixel disposed in the substrate;
a light-reflective structure disposed over the back side of the substrate;
a color filter disposed over the back side of the substrate, the color filter having a top surface at a first height, the top surface of the color filter facing away from the substrate;
a reference pixel disposed in the substrate, wherein a first portion of the light-reflective structure is disposed directly over the reference pixel thereby preventing light from reaching the reference pixel; and
a passivation layer disposed over the light-reflective structure and having a top surface at the first height, the top surface of the passivation layer facing away from the substrate and interfacing with the top surface of the color filter at the first height.

8. The device of claim 7, wherein the light-reflective structure further includes a second portion and a third portion and wherein the first pixel is disposed within the substrate between the second and third portions of the light-reflective structure.

9. The device of claim 8, wherein the first portion of the light-reflective structure has a first thickness and a first width and the second portion of the light-reflective structure has the first thickness and a second width that is different than the first width.

10. The device of claim 9,
wherein the second width is less than the first width.

11. The device of claim 7, further comprising an anti-reflective coating layer disposed over the back side of the substrate, and
wherein the light-reflective structure is disposed over the anti-reflective coating layer.

12. The device of claim 7, further comprising:
a bond pad disposed on the interconnect structure;
a dielectric isolation structure disposed within the substrate and interfacing with the bond pad, and
wherein the dielectric isolation structure is positioned closer to the back side of the substrate than the bond pad.

13. The device of claim 7, further comprising:
a first material layer disposed over the back side of the substrate and formed of a first material; and
a second material layer disposed over the first material layer and formed of a second material that is different than the first material, and
wherein the passivation layer extends along and physically contacts a sidewall surface of the second material layer and a sidewall surface of the first material layer.

14. The device of claim 7, wherein the color filter has a sidewall facing a sidewall of the first portion of the light-reflective structure, and
wherein the passivation layer physically contacts the entire sidewall of the color filter and the entire sidewall of the first portion of the light-reflective structure.

15. A device comprising:
a substrate having a first side and a second side that is opposite the first side, the substrate further including a sidewall extending from the first side to the second side of the substrate;
an interconnect structure disposed over the first side of the substrate;
a first pixel disposed in the substrate and extending from the first side of the substrate toward the second side, wherein a portion of the substrate is disposed between the first pixel and the second side of the substrate;
a radiation-blocking structure disposed over the second side of the substrate, wherein the radiation-blocking structure includes a first portion and a second portion and wherein the first pixel is disposed within the substrate between the first and second portions of the radiation-blocking structure;
a passivation layer extending from over the light-reflective structure to the sidewall of the substrate such that the passivation layer extends along and physically contacts the sidewall of the substrate;
a shallow trench isolation structure disposed within the substrate; and
a bond pad interfacing with shallow trench isolation structure such that the bond pad physically contacts the shallow trench isolation structure.

16. The device of claim 15, further comprising a second pixel disposed in the substrate, and
wherein the radiation-blocking structure further includes a third portion disposed directly over the second pixel thereby blocking radiation directed toward the second pixel.

17. The device of claim 16, wherein the third portion of the radiation-blocking structure is disposed directly over the shallow trench isolation structure.

18. The device of claim 15, further comprising:
a second pixel disposed in the substrate;
a first color filter segment disposed directly over the first pixel; and
a second color filter segment disposed directly over the second pixel,
wherein the first color filter segment allows a first color of light to pass through the first color filter segment while filtering out a second color of light, and
wherein the second color filter segment allows the second color of light to pass through the second color filter segment while filtering out the first color of light.

19. The device of claim 18, wherein the radiation-blocking structure further includes a third portion,
wherein the second pixel is disposed within the substrate between the second portion and the third portion of the radiation-blocking structure,
wherein the first color filter segment is disposed between the first portion and the second portion of the radiation-blocking structure, and
wherein the second color filter segment is disposed between the second portion and the third portion of the radiation-blocking structure.

20. The device of claim 15, wherein the passivation layer extends to the shallow trench isolation structure disposed within the substrate.

* * * * *